(12) United States Patent
Lai et al.

(10) Patent No.: US 12,003,239 B2
(45) Date of Patent: Jun. 4, 2024

(54) LOW-POWER FLIP FLOP CIRCUIT

(71) Applicant: Taiwan Semiconductor Manufacturing Co., Ltd., Hsin-Chu (TW)

(72) Inventors: Po-Chia Lai, Fremont, CA (US); Meng-Hung Shen, Zhubei (TW); Chi-Lin Liu, New Taipei (TW); Stefan Rusu, Sunnyvale, CA (US); Yan-Hao Chen, Hsin-Chu (TW); Jerry Chang-Jui Kao, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 17/976,187

(22) Filed: Oct. 28, 2022

(65) Prior Publication Data

US 2023/0048735 A1 Feb. 16, 2023

Related U.S. Application Data

(62) Division of application No. 17/180,379, filed on Feb. 19, 2021, now abandoned, which is a division of application No. 16/437,541, filed on Jun. 11, 2019, now Pat. No. 10,931,264, which is a division of application No. 15/485,595, filed on Apr. 12, 2017, now Pat. No. 10,326,430.

(60) Provisional application No. 62/428,443, filed on Nov. 30, 2016.

(51) Int. Cl.
*H03K 3/3562* (2006.01)
*H03K 3/012* (2006.01)
*H03K 3/0233* (2006.01)
*H03K 3/037* (2006.01)
*H03K 3/289* (2006.01)
*H03K 3/356* (2006.01)

(52) U.S. Cl.
CPC ......... *H03K 3/012* (2013.01); *H03K 3/02332* (2013.01); *H03K 3/0372* (2013.01); *H03K 3/289* (2013.01); *H03K 3/356104* (2013.01); *H03K 3/3562* (2013.01); *H03K 3/35625* (2013.01)

(58) Field of Classification Search
CPC ............. H03K 3/012; H03K 3/356104; H03K 3/02332; H03K 3/0372; H03K 3/289; H03K 3/3562; H03K 3/35625
See application file for complete search history.

(56) References Cited

U.S. PATENT DOCUMENTS

| 9,397,641 B2 * | 7/2016 | Hsu ................... H03K 3/35625 |
| 9,923,552 B2 | 3/2018 | Blutman |
| 10,326,430 B2 | 6/2019 | Lai et al. |
| 2004/0150449 A1 | 8/2004 | Durham et al. |

* cited by examiner

*Primary Examiner* — Jung Kim
(74) *Attorney, Agent, or Firm* — Duane Morris LLP

(57) ABSTRACT

A flip-flop circuit configured to latch an input signal to an output signal is disclosed. The circuit includes a first latch circuit; and a second latch circuit coupled to the first latch circuit. In some embodiments, in response to a clock signal, the first and second latch circuits are complementarily activated so as to latch the input signal to the output signal, and the first and second latch circuits each comprises at most two transistors configured to receive the clock signal.

20 Claims, 8 Drawing Sheets

LOW-POWER FLIP FLOP CIRCUIT

CROSS-REFERENCE TO RELATED APPLICATION

This application is a Division of U.S. patent application Ser. No. 17/180,379, filed Feb. 19, 2021, which is a Division of U.S. patent application Ser. No. 16/437,541, filed Jun. 11, 2019, now U.S. Pat. No. 10,931,264, which is a Division of U.S. patent application Ser. No. 15/485,595, filed Apr. 12, 2017, now U.S. Pat. No. 10,326,430, which claims priority to U.S. Provisional Patent Application No. 62/428,443, filed on Nov. 30, 2016, each of which are incorporated by reference herein in their entireties.

BACKGROUND

In accordance with the Moore's Law, the number of transistors on an integrated circuit doubles every two years. Although such a high packing density allows more functions to be incorporated per unit area of an integrated circuit, it is becoming increasingly difficult for foundries to manufacture a defect free integrated circuit as packing densities continue to increase. This predicament has exalted the significance of Design-for-Testability (DFT) in an integrated circuit design. Scan chain testing, for example, is one of various techniques that utilize DFT methods to detect manufacturing faults in an integrated circuit. One or more scan flip-flops are typically used to perform a scan chain testing on an integrated circuit.

Generally, conventional scan flip-flops use one or more clock inversion or buffer circuits, e.g., a transmission gate, to generate a complementary clock signal to perform a scan chain test. However, the transmission gate in a scan flip-flop typically occupies a relatively large area of an integrated circuit, which may disadvantageously require allocation of valuable real estate of the integrated circuit (IC), and, in turn, increase design complexity of the IC. Moreover, operating such transmission gates typically consumes additional power. Thus, conventional scan flip-flops have not been entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of a scan flip-flop circuit that can be used to perform a scan test (e.g., a scan chain testing) without using a complementary clock signal. More specifically, the disclosed scan flip-flop circuit utilizes one or more complex logic gates, e.g., an OR-AND-Inverter (OAI), an AND-OR-Inverter (AOI), etc., to circumvent the use of transmission gates that are conventionally used to generate a complementary clock signal, which advantageously reduces power consumption of the disclosed scan flip-flop circuit. Also, by using the complex logic gates, one or more performance characteristics of the scan flop-flop circuit may be improved, for example, a more robust hold time (i.e., less susceptible to manufacturing variations), a shorter hold time, etc.

Figure 1:
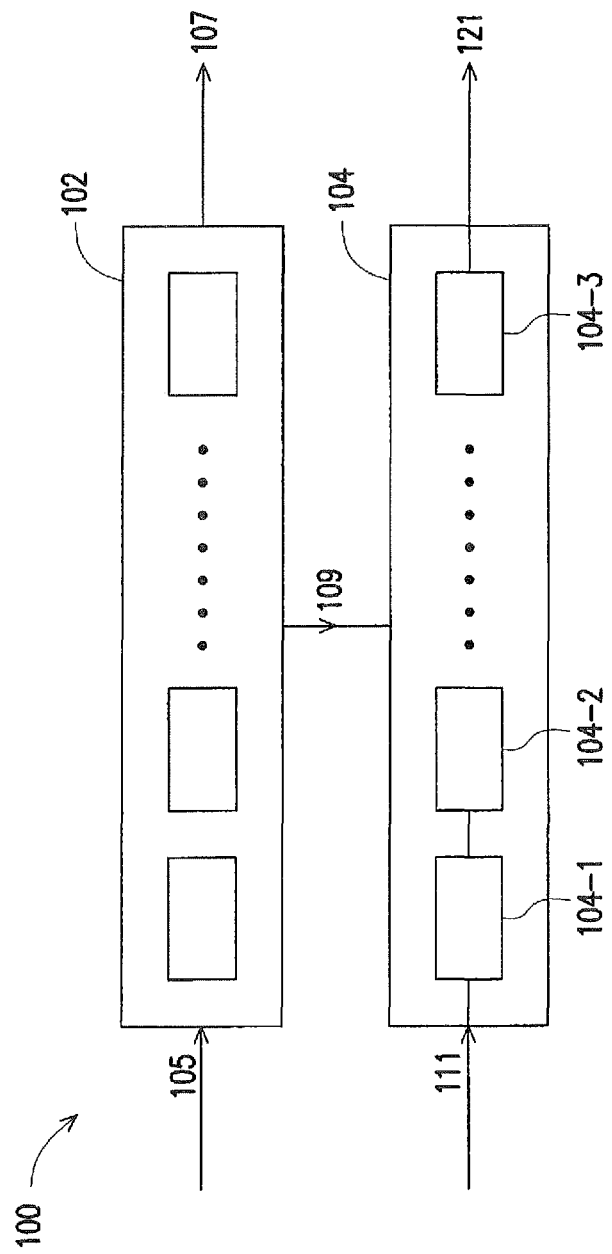
FIG. 1 illustrates an exemplary block diagram of a circuit that includes a to-be tested circuit and a scan chain testing circuit, in accordance with some embodiments.

FIG. 1 illustrates an exemplary block diagram of a circuit 100 including a to-be tested circuit 102 and a scan chain testing circuit 104, in accordance with various embodiments. Although the illustrated embodiment of FIG. 1 shows that the to-be tested circuit 102 and the scan chain testing circuit 104 are two different and separate blocks, in some embodiments, the to-be tested circuit 102 and the scan chain testing circuit 104 may be integrated together. In some embodiments, the to-be tested circuit 102 includes a combinational logic circuit including a plurality of logic gates interconnected with each other, and the scan chain testing circuit 104 includes one or more scan flip-flop circuits, e.g., 104-1, 104-2, 104-3, etc., coupled with each other as a chain. More specifically, each scan flip-flop circuit (104-1, 104-2, 104-3, etc.) is coupled to a respective subset of logic gates of the to-be tested circuit 102. In some embodiments, the scan chain testing circuit 104 is configured to switch between at least two modes: a normal operation mode and a scan test mode. When the scan testing circuit 104 operates under the normal operation mode, the scan testing circuit 104 receives a data signal 109 while the to-be tested circuit 102 normally generates its output signal 107 in response to input signal 105. When the scan testing circuit 104 operates under the scan test mode, the scan chain testing circuit 104 receives a scan-in signal 111 and generates a scan-out signal 121. In some embodiments, fault(s) of one or more scan flip-flop circuits (i.e., one or more malfunctioning flip-flop circuits) of the scan testing circuit 104 may be detected by comparing one or more differences between the scan-in signal 111 and scan-out signal 121. And such a malfunctioning flip-flop circuit may be used to pinpoint which corresponding subset of logic gates are malfunctioning.

Figure 2A:
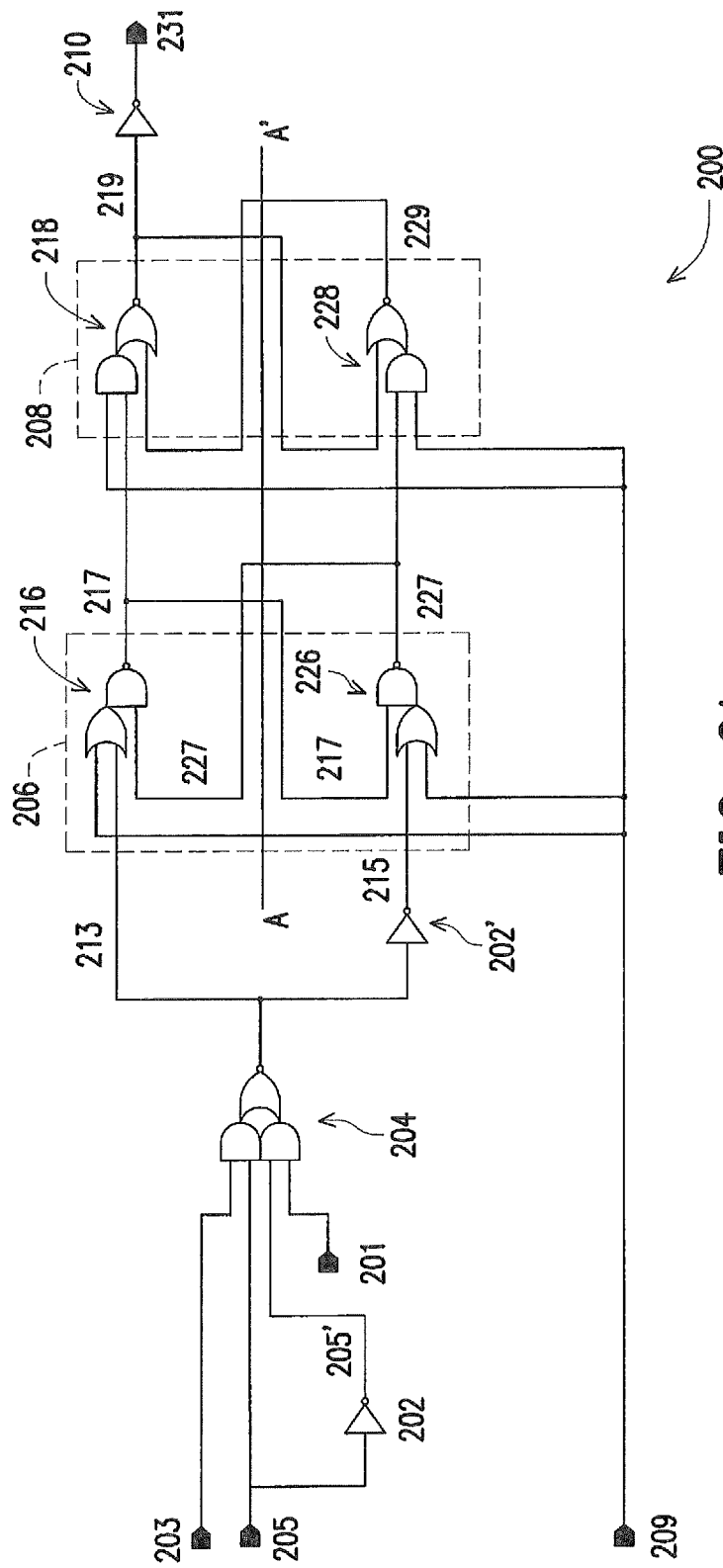
FIG. 2A illustrates an exemplary circuit diagram, at a gate level, of a scan flip-flop circuit of the scan chain testing circuit of FIG. 1, in accordance with some embodiments.

FIG. 2A illustrates an exemplary circuit diagram of one of the scan flip-flop circuits (104-1, 104-2, 104-3) of the scan chain testing circuit 104 at a gate-level, in accordance with various embodiments. In some embodiments, the scan flip-flop circuits of the scan chain testing circuit 104 are substantially similar to one another so that the following discussions are directed to one or more embodiments of one of the scan flip-flop circuits (104-1, 104-2, 104-3, etc.). For clarity, the exemplary circuit diagram of FIG. 2A in the following discussion is referred to as scan flip-flop circuit 200.

The scan flip-flop circuit 200 is configured to receive input signals 201, 203, and 205, and provide an output signal 231 based on a synchronization signal 209. In some embodiments, the input signal 201 may be a data signal provided from the respective subset of logic gates of the to-be tested circuit 102, e.g., 109 of FIG. 1. In some embodiments, the data signal 201 may include data generated based on logic operations of the respective subset of logic gates. The input signal 203 may be a scan-in signal, e.g., 111 of FIG. 1, used to provide the above-mentioned scan test. In some embodiments, the scan-in signal 203 may include one or more test patterns that are used to detect a fault of a scan flip-flop circuit, as mentioned above. Such scan-in signals (e.g., 203) may be provided by an automatic test pattern generation (ATPG) technology. The input signal 205 may be a scan enable signal that is used to selectively cause the scan flip-flop circuit 200 to operate under either the above-mentioned normal mode or the scan test mode. In some embodiments, the synchronization signal 209 may be a clock signal that is used to provide a clock reference for the output signal 231 to follow either the data signal 201 or the scan-in signal 203, depending on which mode the scan flip-flop circuit 200 is selected to operate.

As shown, the scan flip-flop circuit 200 includes a first inverter 202, a multiplexer 204, a second inverter 202', a master latch circuit 206, a slave latch circuit 208, and a third inverter 210. In some embodiments, the multiplexer 204 is configured to selectively couple either the data signal 201 or the scan-in signal 203 to the master and slave latch circuits (206 and 208) based on the scan enable signal 205. For example, when the scan enable signal 205 is asserted to a logical low state (e.g., a logical "0"), the multiplexer 204 may couple the data signal 201 to the latch circuits 206 and 208; when the scan enable signal 205 is asserted to a logical high state (e.g., a logical "1"), the multiplexer 204 may couple the scan-in signal 203 to the latch circuits 206 and 208. It is understood that the signals coupled by the multiplexer 204 in response to the logical state of the scan enable signal 205 may be reversed from the above while remaining within the scope of the present disclosure. When the data signal 201 is selected (i.e., the data signal 201 is coupled to the master and slave latch circuits 206 and 208), in some embodiments, the master and slave latch circuits 206 and 208 are configured to cause the output signal 231 to follow the data signal 201 based on the clock signal 209, which will be discussed in further detail below.

Referring still to FIG. 2A, in some embodiments, the master latch circuit 206 includes a pair of cross-coupled OR-AND-Inverters (OAI's) 216 and 226; and the slave latch circuit 208 includes a pair of cross-coupled AND-OR-Inverters (AOI's) 218 and 228. The term "cross-coupled" used herein means that the OAI 216 and the OAI 226 each includes an output coupled to the other's input. Similarly, the AOI 218 and the AOI 228 each includes an output coupled to the other's input, which will be described in further detail below. The OAI 216 is coupled to the multiplexer 204, and the OAI 226 is coupled to the multiplexer 204 through the second inverter 202'. More specifically, OAI 216 is configured to receive either the data signal 201 or the scan-in signal 203 (hereinafter signal 213) and a signal 227 provided by the OAI 226. Then the OAI 216 is further configured to perform an "OAI" logic function on the signals 213 and 227 based on the clock signal 209, and output signal 217. Similarly, the cross-coupled OAI 226 is configured to receive either a logically inverted data signal 201 or a logically inverted scan-in signal 203 through the first inverter 202 (hereinafter signal 215), and also the signal 217 provided by the OAI 216. Then the OAI 226 is configured to perform the "OAI" logic function on the signals 215 and 217 based on the clock signal 209, and output signal 227.

In some embodiments, the output signal 217 and 227 are provided to the cross-coupled AOI's 218 and 228 of the slave latch circuit 208. More specifically, the AOI 218 is configured to receive the signal 217 and a signal 229 provided by the AOI 228, then perform an "AOI" logic function on the signals 217 and 229 based on the clock signal 209, and output signal 219 to the third inverter 210; the AOI 228 is configured to receive the signal 227 and the signal 219 provided by the AOI 218, then perform an "AOI" logic function on the signals 227 and 219 based on the clock signal 209, and output the signal 229. Accordingly, in some embodiments, the third inverter 210 may provide the output signal 231 based on a logical inversion of the signal 219.

In some embodiments, the OAI's (216 and 226) of the master latch circuit 206 and the AOI's (218 and 228) of the slave latch circuit 208 may be activated complementarily in accordance with the clock signal 209. More specifically, when the clock signal 209 transitions from a low logical state to a high logical state (i.e., the clock signal 209 at the high logical state), the master latch circuit 206 is activated and the slave latch circuit 208 is deactivated. As such, the master latch circuit 206 may latch either the signal 201 or 203 to the third inverter 210 while the slave latch circuit 208 may serve as a "transparent" circuit. When the clock signal 209 transitions from the high logical state to the low logical state (i.e., the clock signal 209 at the low logical state), the master latch circuit 206 is deactivated and, on the other hand, the slave latch circuit 208 is activated. As such, the slave latch circuit 208 may directly latch either the signal 201 or 203 to the third inverter 210 while the master latch circuit 206 may serve as a "transparent" circuit.

Figure 2B:
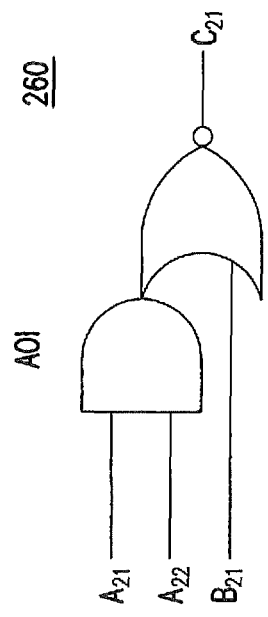
FIG. 2B illustrates exemplary circuit diagrams of an OR-AND-Inverter (OAI) logic gate and an AND-OR-Inverter (AOI) logic gate, and the respective truth tables, in accordance with some embodiments.
Figure 2B:
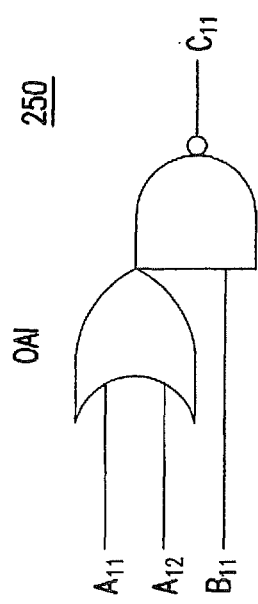

Referring to FIG. 2B, an OAI 250 and an AOI 260, and their respective truth tables (OAI truth table and AOI truth table) are shown, in accordance with various embodiments. In some embodiments, the OAI's (216 and 226) of the master latch circuit 206 each has a substantially similar functionality to the OAI 250. Accordingly, each of the OAI's (216 and 226) may use the corresponding truth table as shown in FIG. 2B (i.e., the "OAI truth table") to perform the above-mentioned OAI logic function. Similarly, the AOI's (218 and 228) of the slave latch circuit 208 each has a substantially similar functionality to the AOI 260. Thus, each of the AOI's (218 and 228) may use the truth table as shown in FIG. 2B (i.e., the "AOI truth table") to perform the above-mentioned AOI logic function. More specifically, in some embodiments, the OAI 216 may use the signal 213 as $A_{11}$, the clock signal 209 as $A_{12}$, and the signal 227 as $B_{11}$, and output $C_{11}$ as the signal 217, wherein a logical state of the signal 217 is determined by the OAI truth table and a combination of logical states of the signals 209, 213, and 227. For example, when the logical states of the signals 209, 213, and 227 are at a logical "1," a logical "0," and a logical "1," respectively, according to the OAI truth table, the signal 217 is at a logical "0." The OAI 226 may use the signal 215 as $A_{11}$, the clock signal 209 as $A_{12}$, and the signal 217 as $B_{11}$, and output $C_{11}$ as the signal 227, wherein a logical state of the signal 227 is determined by the OAI truth table and a combination of logical states of the signals 209, 215, and 217. Similarly, the AOI 218 may use the signal 217 as $A_{21}$, the clock signal 209 as $A_{22}$, and the signal 229 as $B_{21}$, and output $C_{21}$ as the signal 219, wherein a logical state of the signal 219 is determined by the AOI truth table and a combination of logical states of the signals 209, 217, and 229; the AOI 228 may use the signal 227 as $A_{21}$, the clock signal 209 as $A_{22}$, and the signal 219 as $B_{21}$, and output $C_{21}$ as the signal 229, wherein a logical state of the signal 229 is determined by the AOI truth table and a combination of logical states of the signals 209, 227, and 219.

By using the OAI (e.g., 216, 226, etc.) and AOI (e.g., 218, 228, etc.) in a scan flip-flop circuit (e.g., 200), in some embodiments, the clock signal 209 of the scan flip-flop circuit 200 may be commonly used by the OAI's (216 and 226) and AOI's (218 and 228), respectively. As such, a logically inverted clock signal and corresponding components (e.g., one or more inverters) used to generate such a logically inverted clock signal may not be needed, which may advantageously reduce power consumption and design complexity of the scan flip-flop circuit 200. Further, as shown in FIG. 2A, the cross-coupled OAI's (216 and 226) are symmetric to each other over line AA', and the cross-coupled AOI's (218 and 228) are also symmetric to each other over the line AA'. By using such a symmetric characteristic of the cross-coupled OAI's and AOI's of the flip-flop circuit 200, respectively, a number of transistors used to implement the OAI's and AOI's, respectively, may be substantially reduced compared to the conventional scan flip-flop circuit that uses a transmission gate. The reduced number of transistors may further reduce power consumption and design complexity of the scan flip-flop circuit 200, which will be discussed in further detail below with respect to FIG. 2C.

Figure 2C:
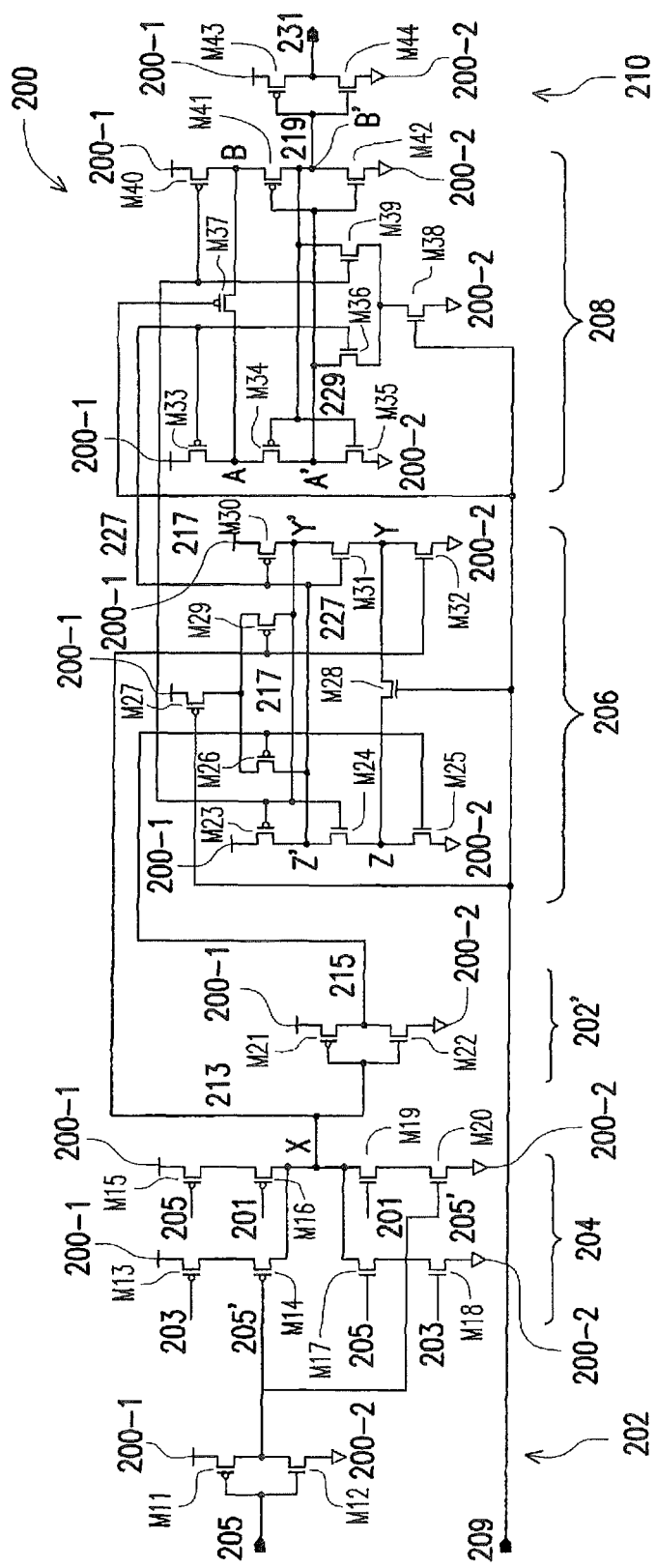
FIG. 2C illustrates an exemplary circuit diagram, at a transistor level, of the scan flip-flop circuit of FIG. 2A, in accordance with some embodiments.

FIG. 2C illustrates an exemplary circuit diagram of the scan flip-flop circuit 200 at a transistor-level, in accordance with various embodiments. As shown, each of the gate-level components (202, 204, 202', 206, 208, and 210) of the scan flip-flop circuit 200 may be implemented by one or more transistors. It is understood that the circuit diagram shown in FIG. 2C is merely an example to implement the gate-level components of the scan flip-flop circuit 200. Each of the gate-level components of the scan flip-flop circuit 200 may be implemented by any of a variety of circuit designs while remaining within the scope of the present disclosure.

In some embodiments, the first inverter 202 is implemented by transistors $M_{11}$ and $M_{12}$ that are connected in series between a first supply voltage 200-1 (e.g., Vdd) and a second supply voltage 200-2 (e.g., ground). For brevity, the first and second supply voltages 200-1 and 200-2 are hereinafter referred to as Vdd and ground, respectively. In some embodiments, the transistor $M_{11}$ includes a p-type metal-oxide-semiconductor (PMOS) transistor (hereinafter "PMOS"), and the transistor $M_{12}$ includes an n-type metal-oxide-semiconductor (NMOS) transistor (hereinafter "NMOS"). Further, gates of the transistors $M_{11}$ and $M_{12}$ are commonly coupled to the scan enable signal 205, and a common node, coupled to respective drains of the transistors $M_{11}$ and $M_{12}$, is configured to provide signal 205' that is logically inverted to the scan enable signal 205.

In some embodiments, the multiplexer 204 is implemented by transistors $M_{13}$, $M_{14}$, $M_{15}$, $M_{16}$, $M_{17}$, $M_{18}$, $M_{19}$, and $M_{20}$. More specifically, transistors $M_{13}$ and $M_{14}$ are connected in series between Vdd and a common node "X;" transistors $M_{15}$ and $M_{16}$ are connected in series between Vdd and the node X; transistors $M_{17}$ and $M_{18}$ are connected in series between the node X and ground; transistors $M_{19}$ and $M_{20}$ are connected in series between the node X and ground. In some embodiments, gates of the serially connected transistors $M_{13}$ and $M_{14}$ are configured to receive signals 203 and 205', respectively; gates of the serially connected transistors $M_{15}$ and $M_{16}$ are configured to receive signals 205 and 201, respectively; gates of the serially connected transistors $M_{17}$ and $M_{18}$ are configured to receive signals 205 and 203, respectively; gates of the serially connected transistors $M_{19}$ and $M_{20}$ are configured to receive signals 201 and 205', respectively. In some embodiments, transistors $M_{13}$, $M_{14}$, $M_{15}$, and $M_{16}$ each includes a PMOS; and transistors $M_{17}$, $M_{18}$, $M_{19}$, and $M_{20}$ each includes an NMOS. By implementing the multiplexer 204 in accordance with such a circuit design, the multiplexer 204 may selectively couple either the signal 201 or the signal 203 to the node X as the signal 213 based on the logical state of the scan enable signal 205, as described above.

Similar to the first inverter 202, the second inverter 202' is also implemented as a pair of serially coupled transistors $M_{21}$ and $M_{22}$. In some embodiments, the transistors $M_{21}$ and $M_{22}$ are coupled between Vdd and ground. The transistor $M_{21}$ includes a PMOS, and the transistor $M_{22}$ includes an NMOS. Gates of the transistors $M_{21}$ and $M_{22}$ are commonly coupled to the node X so as to receive the single 213, and drains of the transistors $M_{21}$ and $M_{22}$ are coupled to a common node so as to provide the signal 215 that is logically inverted to the signal 213.

In accordance with various embodiments of the present disclosure, the master latch circuit 206 includes transistors $M_{23}$, $M_{24}$, $M_{25}$, $M_{26}$, $M_{27}$, $M_{28}$, $M_{29}$, $M_{30}$, $M_{31}$, and $M_{32}$. More specifically, the OAI 226 of the master latch circuit 206 may be formed by the transistors $M_{23}$, $M_{24}$, $M_{25}$, $M_{26}$, $M_{27}$, and $M_{28}$; and the OAI 216 of the master latch circuit 206 may be formed by the transistors $M_{27}$, $M_{28}$, $M_{29}$, $M_{30}$, $M_{31}$, and $M_{32}$. It is noted that the transistors $M_{27}$ and $M_{28}$ that are configured to receive the clock signal 209 are shared by the cross-coupled OAI's 216 and 226. Such a sharing of transistors $M_{27}$ and $M_{28}$ may be due to the symmetric circuit design of the cross-coupled OAI's 216 and 226 (FIG. 2A). By leveraging such a symmetric characteristic, the master latch circuit 206 of the disclosed scan flip-flop circuit 200 includes at most two transistors that are configured to receive a clock signal (e.g., 209), i.e., at most two transistors are coupled to a clock circuit generating the clock signal. In some embodiments, such a transistor coupled to a clock circuit is referred to as a "clock-coupled" transistor hereinafter. Accordingly, a number of transistors used to implement the master latch circuit of the disclosed scan-flip flop circuit 200 is substantially reduced, which advantageously reduces the power consumption and design complexity of the scan flip-flop circuit 200. Similarly, a number of transistors used to implement the slave latch circuit of the disclosed scan-flip flop circuit 200 is also substantially reduced, which may further reduce the power consumption and design complexity of the scan flip-flop circuit 200. An exemplary embodiment of the slave latch circuit of the disclosed scan-flip flop circuit 200 will be discussed in further detail below.

Referring still to the master latch circuit 206, in some embodiments, transistors $M_{24}$, $M_{25}$, $M_{28}$, $M_{31}$, and $M_{32}$ each includes an NMOS, and transistors $M_{23}$, $M_{26}$, $M_{27}$, $M_{29}$, and $M_{30}$ each includes a PMOS. More specifically, the clock-coupled transistors $M_{27}$ and $M_{28}$ are each configured to receive the clock signal 209 at their respective gates. The transistor $M_{27}$ is coupled between Vdd and sources of the transistors $M_{26}$ and $M_{29}$. The transistor $M_{28}$ is coupled between node Y at the transistor $M_{28}$'s drain that is also coupled to a source of the transistor $M_{31}$ and a drain of the transistor $M_{32}$, and node Z at the transistor $M_{28}$'s source that is coupled to a source of the transistor $M_{24}$ and a drain of the transistor $M_{25}$. The signal 213 is received by the transistors $M_{29}$ and $M_{32}$ at their respective gates, and the signal 215 is received by the transistors $M_{25}$ and $M_{26}$ at their respective gates. In some embodiments, the signal 217, provided based on logical states of the signals 213, 209, and 227, is generated from a common node Y' that is coupled to a drain of the transistor $M_{29}$, a drain of the transistor $M_{30}$, and a drain of the transistor $M_{31}$, and fed into gates of the transistors $M_{23}$ and $M_{24}$. The signal 227, provided based on logical states of the signals 215, 209, and 217, is generated from a common node Z' that is coupled to a drain of the transistor $M_{23}$, a drain of the transistor $M_{24}$, and a drain of the transistor $M_{26}$, and fed into gates of the transistors $M_{30}$ and $M_{31}$. By implementing the master latch circuit 206 in accordance with such a circuit design, the master latch circuit 206 may, based on the logical state of the clock signal 209, latch either the signal 201 or the signal 203 as the signals 217 and 227 to the third inverter 210, as described above.

Similarly, in some embodiments, the slave latch circuit 208 includes transistors $M_{33}$, $M_{34}$, $M_{35}$, $M_{36}$, $M_{37}$, $M_{38}$, $M_{39}$, $M_{40}$, $M_{41}$, and $M_{42}$. More specifically, the AOI 228 of the slave latch circuit 208 may be formed by the transistors $M_{33}$, $M_{34}$, $M_{35}$, $M_{36}$, $M_{37}$, and $M_{38}$; and the AOI 218 of the slave latch circuit 208 may be formed by the transistors $M_{37}$, $M_{38}$, $M_{39}$, $M_{40}$, $M_{41}$, and $M_{42}$. Similar to the master latch circuit 206, the transistors $M_{37}$ and $M_{38}$ that are configured to receive the clock signal 209 are shared by the cross-coupled AOI's 218 and 228. As described above, such a sharing of the clock-coupled transistors, i.e., $M_{37}$ and $M_{38}$, by the cross-coupled AOI's 218 and 228 may in turn reduce the power consumption and design complexity of the scan flip-flop circuit 200.

In some embodiments, transistors $M_{35}$, $M_{36}$, $M_{38}$, $M_{39}$, and $M_{42}$ of the slave latch circuit 208 each includes an NMOS, and transistors $M_{33}$, $M_{34}$, $M_{37}$, $M_{40}$, and $M_{41}$ of the slave latch circuit 208 each includes a PMOS. More specifically, the clock-coupled transistors $M_{37}$ and $M_{38}$ are each configured to receive the clock signal 209 at their respective gates. The transistor $M_{38}$ is coupled between ground and sources of the transistors $M_{36}$ and $M_{39}$. The transistor $M_{37}$ is coupled between node A at the transistor $M_{37}$'s drain that is also coupled to a source of the transistor $M_{34}$ and a drain of the transistor $M_{33}$, and node B at the transistor $M_{37}$'s source that is coupled to a source of the transistor $M_{41}$ and a drain of the transistor $M_{40}$. The signal 217 is received by the transistors $M_{39}$ and $M_{40}$ at their respective gates, and the signal 227 is received by the transistors $M_{33}$ and $M_{36}$ at their respective gates. In some embodiments, the signal 219, provided based on logical states of the signals 217, 209, and 229, is generated from a common node B' that is coupled to a drain of the transistor $M_{41}$, a drain of the transistor $M_{42}$, and a drain of the transistor $M_{39}$, and fed into gates of the transistors $M_{34}$ and $M_{35}$. The signal 229, provided based on logical states of the signals 227, 209, and 219, is generated from a common node A' that is coupled to a drain of the transistor $M_{34}$, a drain of the transistor $M_{35}$, and a drain of the transistor $M_{36}$, and fed into gates of the transistors $M_{41}$ and $M_{42}$. By implementing the slave latch circuit 208 in accordance with such a circuit design, the slave latch circuit 208 may, based on the logical state of the clock signal 209, latch either the signal 201 or the signal 203 to the third inverter 210, as described above.

In some embodiments, the third inverter 210 is also implemented as a pair of serially coupled transistors $M_{43}$ and $M_{44}$. In some embodiments, the transistors $M_{43}$ and $M_{44}$ are coupled between Vdd and ground. The transistor $M_{43}$ includes a PMOS, and the transistor $M_{44}$ includes an NMOS. Transistors $M_{43}$ and $M_{44}$ are commonly coupled to the slave latch circuit 208 so as to receive the single 219 at their respective gates, and drains of the transistors $M_{43}$ and $M_{44}$ are coupled to a common node so as to provide the signal 231 that is logically inverted to the signal 219.

In accordance with various embodiments of the present disclosure, the disclosed scan flip-flop circuit 200 uses the cross-coupled AOI's and OAI's, and their symmetric characteristic, as described above. As such, the number of "clock-coupled" transistors of the disclosed scan flip-flop circuit 200 may be substantially reduced to 4, which is much lower than a number of clock-coupled transistors (e.g., at least 12) of the conventional scan flip-flop circuit that use a transmission gate. The substantially reduced number of the clock-coupled transistors may advantageously reduce the power consumption of the disclosed scan flip-flop circuit, for example, by about 33%. Moreover, since each of the AOI's/OAI's has a higher number of stacks than conventional transmission gate flip flop (each AND gate corresponds to a stack), the disclosed scan flip-flop circuit may have a lower leakage current.

Figure 3:
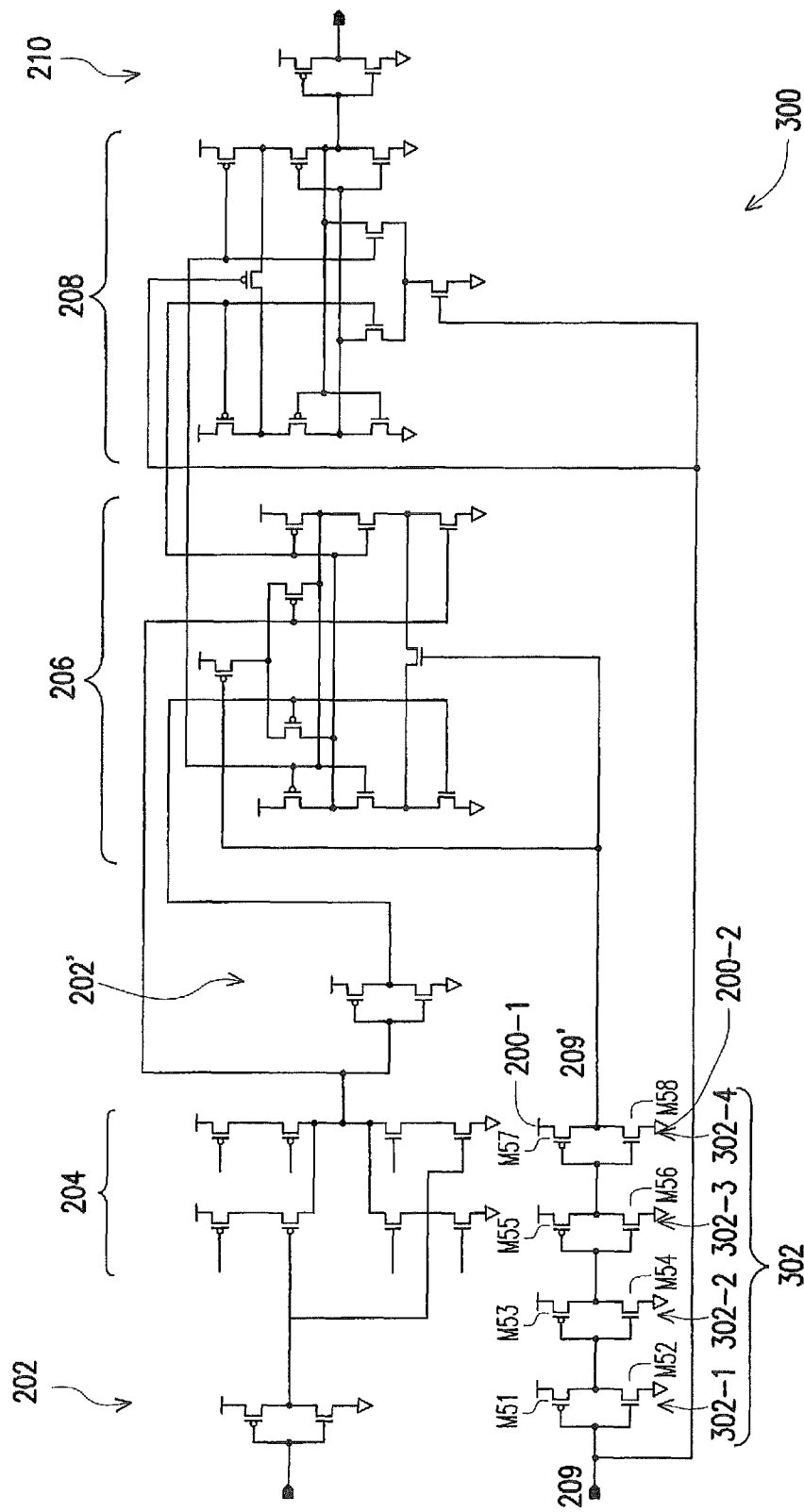
FIG. 3 illustrates an exemplary circuit diagram, at a transistor level, of another scan flip-flop circuit, in accordance with some embodiments.

FIG. 3 illustrates an exemplary circuit diagram at the transistor-level of a scan flip-flop circuit 300 that includes a "time-borrowing" feature, in accordance with various embodiments. As shown, the scan flip-flop circuit 300 is substantially similar to the scan flip-flop circuit 200 of FIGS. 2A and 2C except that the scan flip-flop circuit 300 further includes a time-borrowing circuit 302. For clarity, discussions of the components of the scan flip-flop circuit 300 that are substantially similar to those of the scan flip-flop circuit 200, e.g., 202, 204, 202', 206, 208, and 210, are omitted.

In some embodiments, the time-borrowing circuit 302 includes one or more inverters 302-1, 302-2, 302-3, and 302-4 that are serially coupled to one another. Although the illustrated embodiment of FIG. 3 shows the time-borrowing circuit 302 includes 4 inverters, any desired number (e.g., 2~8) of inverters may be included in the time-borrowing circuit 302 while remaining within the scope of the present disclosure. Including such a time-borrowing circuit 302 in the scan flip-flop circuit 300 may delay the clock signal 209 to be received by the master latch circuit 206 by a number of gate delays that corresponds to a number of the inverters included in the time-borrowing circuit 302, while the slave latch circuit 208 receives the clock signal 209 without a delay. In some embodiments, delaying the clock signal 209 to the master latch circuit 206 may advantageously reduce a setup time of the scan flip-flop circuit 300. More specifically, since the clock signal 209 is delayed to be received by the master latch circuit 206 and the clock signal 209 is immediately received by the slave latch circuit 208 without a delay, in some embodiments, the slave latch circuit 208 may provide a transparent window and release data earlier, which causes the master latch circuit 206 to have more time for receiving input data during a current cycle, which in turn reduces the setup time.

In some embodiments, each inverter (e.g., 302-1, 302-2, 302-3, 302-4, etc.) of the time-borrowing circuit 302 is substantially similar to the inverters 202, 202', and 210. Thus, for clarity, the inverter(s) of the time-borrowing circuit 302 will be briefly discussed. For example, the inverter 302-1 includes a pair of serially coupled transistors $M_{51}$ (a PMOS) and $M_{52}$ (an NMOS), and the pair of the serially coupled transistors $M_{51}$ and $M_{52}$ are coupled between Vdd and ground. Gates of the transistors $M_{51}$ and $M_{52}$ are coupled to a common node that is configured to receive the clock signal 209 at the respective gates of transistors $M_{51}$ and $M_{52}$. Drains of the transistors $M_{51}$ and $M_{52}$ are coupled to a common node that is configured to provide a signal that is logically inverted to and has a gate delay behind the clock signal 209. In some embodiments, transistors $M_{53}$ and $M_{54}$ of the inverter 302-2, transistors $M_{55}$ and $M_{56}$ of the inverter 302-3, and transistors $M_{57}$ and $M_{58}$ of the inverter 302-4 have similar functionalities to the transistors $M_{51}$ and $M_{52}$, respectively. As such, clock signal 209' received by the master latch circuit 206 may have about four gate delays behind the clock signal 209.

Figure 4:
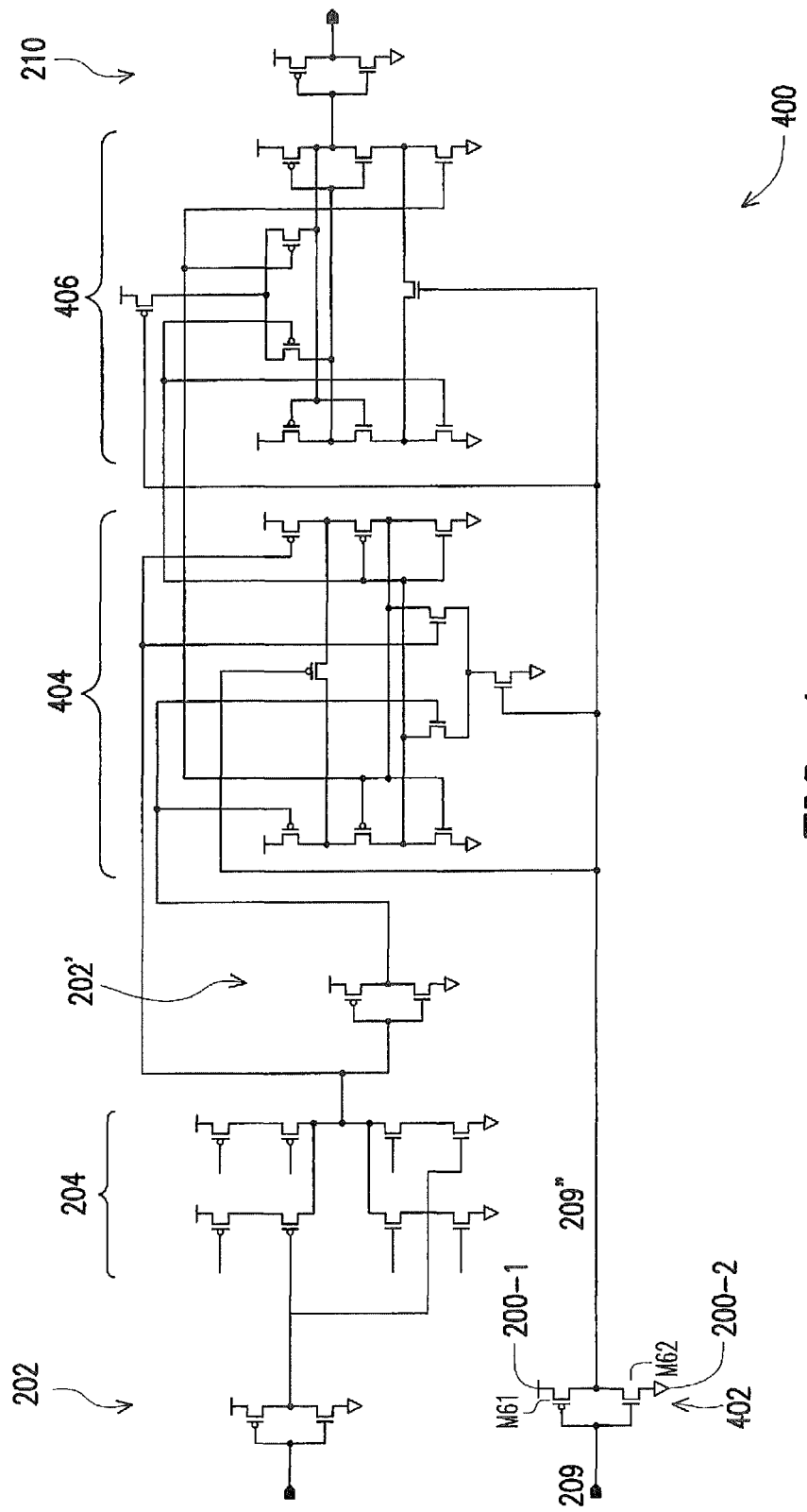
FIG. 4 illustrates an exemplary circuit diagram, at a transistor level, of yet another scan flip-flop circuit, in accordance with some embodiments.

FIG. 4 illustrates an exemplary circuit diagram at the transistor-level of a scan flip-flop circuit 400, in accordance with various embodiments. The scan flip-flop circuit 400 is substantially similar to the scan flip-flop circuit 200 except that master latch circuit 404 of the scan flip-flop circuit 400 includes two cross-coupled AOI's, and slave latch circuit 406 of the scan flip-flop circuit 400 includes two cross-coupled OAI's. In other words, the master latch circuit 404 is substantially similar to the slave latch circuit 208 (FIG. 2C), and the slave latch circuit 406 is substantially similar to the master latch circuit 206 (FIG. 2C). Thus, for clarity, discussions of the master and slave latch circuits 404 and 406 are omitted. By disposing the AOI's to the master latch circuit 404 and the OAI's to the slave latch circuit 406 (i.e., swapping the AOI's and OAI's), one or more additional clock buffer circuits can be integrated into the scan flip-flop circuit 400 thereby reducing a loading to a clock circuit (i.e., the circuit to provide the clock signal 209).

In order to implement the master latch circuit 404 by the AOI's and the slave latch circuit 406 the OAI's, the scan flip-flop circuit 400 further includes an inverter 402 that is configured to receive the clock signal 209 and provide a logically inverted signal 209'' to the master and slave latch circuits 404 and 406, respectively. In some embodiments, the inverter 402, including a pair of serially coupled PMOS $M_{61}$ and NMOS $M_{62}$, is substantially similar to the above-described inverters (e.g., 302-1, 302-2, 302-3. 302-4, etc.) so the discussion of the inverter 402 is omitted.

Figure 5:
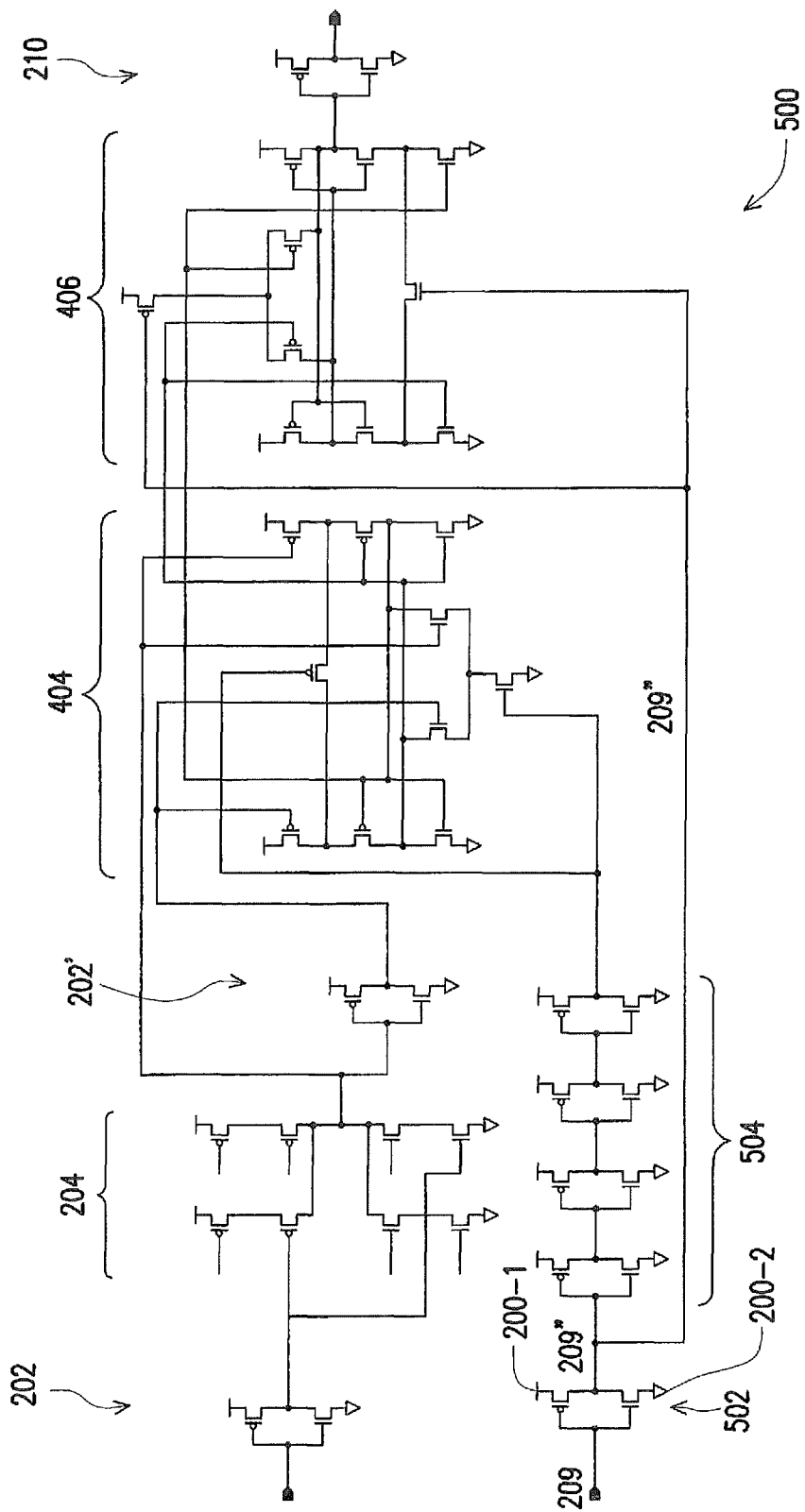
FIG. 5 illustrates an exemplary circuit diagram, at a transistor level, of still yet another scan flip-flop circuit, in accordance with some embodiments.

FIG. 5 illustrates an exemplary circuit diagram at the transistor-level of a scan flip-flop circuit 500 that includes the time-borrowing feature (FIG. 3), and uses the AOI's at a master latch circuit and OAI's at a slave latch circuit (FIG. 4), in accordance with various embodiments. It is noted that the scan flip-flop circuit 500 is substantially similar to a combination of the scan flip-flop circuits 300 and 400 so that the scan flip-flop circuit 500 will be briefly discussed as follows. In some embodiments, the scan flip-flop circuit 500 includes an inverter 502 and a time-borrowing circuit 504 coupled between the inverter 502 and the latch circuits 404 and 406. The inverter 502 is substantially similar to the above-described inverters, and the time-borrowing circuit 504 is substantially similar to the time-borrowing circuit 302 of FIG. 3. Operatively, in some embodiments, the inverter 502 is configured to receive the clock signal 209 and provide a logically inverted signal 209''. The logically inverted signal 209'' is provided to the slave latch circuit 406 without a delay, and is provided to the master latch circuit 404 with about four gate delays, which are provided by the time-borrowing circuit 504. In some embodiments, the scan flip-flop circuit 500 may provide both the time-borrowing feature (FIG. 3) and the feature of a reduced loading to a clock circuit (FIG. 4).

Figure 6:
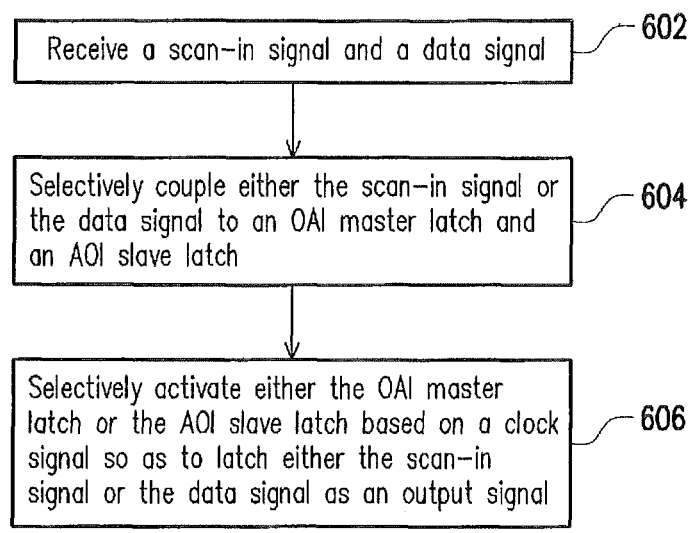
FIG. 6 illustrates an exemplary flow chart of a method to operate the scan flip-flop circuit of FIG. 2A, in accordance with various embodiments.

FIG. 6 illustrates a flow chart of a method 600 to operate the scan flip-flop circuit 200 of FIGS. 2A-2C, in accordance with various embodiments. In various embodiments, the operations of the method 600 are performed by the respective components illustrated in FIGS. 2A-2C. For purposes of discussion, the following embodiment of the method 600 will be described in conjunction with FIGS. 2A-2C. The illustrated embodiment of the method 600 is merely an example. Therefore, it should be understood that any of a variety of operations may be omitted, re-sequenced, and/or added while remaining within the scope of the present disclosure.

The method 600 starts with operation 602 in which a scan-in signal (e.g., 203) and a data signal (e.g., 201) is received by a scan flip-flop circuit (e.g., 200), in accordance with various embodiments. As mentioned above, in some embodiments, the scan-in signal 203 may include one or more test patterns that are used to detect a fault of a scan flip-flop circuit, and the data signal 201 may include data generated based on logic operations of the respective subset of logic gates.

The method 600 continues to operation 604 in which the scan-in signal and the input signal are selectively coupled to coupled OAI master latch (e.g., 206) and AOI slave latch (e.g., 208), in accordance with various embodiments. As mentioned above, the scan flip-flop circuit 200 further receives the scan enable signal 205 to determine whether the data signal 201 or the scan-in signal 203 is to be provided to following stages (e.g., the OAI master and AOI slave latches 206 and 208) of the scan flip-flop circuit 200. In some embodiments, when the scan enable signal 205 is at the high logical state, the multiplexer 204 provides the scan-in signal 203 to the OAI master and AOI slave latches 206 and 208; and when the scan enable signal 205 is at the low logical state, the multiplexer 204 provides the data signal 201 to the master and slave latches 206 and 208.

The method 600 continues to operation 606 in which the OAI master latch and the AOI slave latch are selectively activated based on a clock signal (e.g., 209) so as to latch either the scan-in signal or the data signal as an output signal, in accordance with various embodiments. As described above, when the clock signal 209 is at the high logical state, the OAI master latch 206 is activated and the AOI slave latch 208 is deactivated; and when the clock signal 209 is at the low logical state, the OAI master latch 206 is deactivated and the AOI slave latch 208 is activated. More specifically, in some embodiments, the OAI master latch 206 and the AOI slave latch 208 each includes at most two transistors configured to receive the clock signal 209.

In an embodiment, a flip-flop circuit configured to latch an input signal to an output signal is disclosed. The circuit includes a first latch circuit; and a second latch circuit coupled to the first latch circuit. In some embodiments, in response to a clock signal, the first and second latch circuits are complementarily activated so as to latch the input signal to the output signal, and the first and second latch circuits each comprises at most two transistors configured to receive the clock signal.

In another embodiment, a flip-flop circuit configured to latch an input signal to an output signal is disclosed. The circuit includes a multiplexer configured to select from at least two signals as the input signal; a first latch circuit serially coupled to the multiplexer; and a second latch circuit serially coupled to the first latch circuit, wherein in response to a clock signal, the first and second latch circuits are complementarily activated so as to latch the input signal to the output signal, and wherein the first and second latch circuits each comprises at most two transistors configured to receive the clock signal.

Yet in another embodiment, a method to operate a flip-flop circuit is disclosed. The method includes receiving a scan-in signal and a data signal; selectively coupling either the scan-in signal or the data signal to coupled master and slave latches; and based on a clock signal, selectively activating either the master latch or the slave latch so as to latch either the scan-in signal or the data signal as an output signal of the flip-flop circuit.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method to operate a flip-flop circuit, comprising:
receiving a scan-in signal and a data signal;
selectively coupling either the scan-in signal or the data signal to coupled master and slave latches; and
based on a clock signal, selectively activating either the master latch or the slave latch so as to latch either the scan-in signal or the data signal as an output signal of the flip-flop circuit, wherein the master latch circuit comprises a pair of cross-coupled AND-OR-Inverter (AOI) logic gates, and the slave latch circuit comprises a pair of cross-coupled OR-AND-Inverter (OAI) logic gates;
providing a logically inverted clock signal to the master latch circuit and the slave latch circuit, respectively; and
delaying the clock signal to the master latch circuit but not delaying the clock signal to the slave latch circuit.

2. The method of claim 1, wherein the master and slave latch circuits each comprises at most two transistors configured to receive the clock signal.

3. The method of claim 2, wherein the at most two transistors of the master and slave latch circuits, respectively, each receives the inverted clock signal at a respective gate.

4. The method of claim 2, further comprising: selecting either the data signal or the scan-in signal as the input signal in response to the scan-enable signal.

5. The method claim 4, further comprising delaying the inverted clock signal before providing it to the at most two transistors of the master latch circuit but not delaying the inverted clock signal before providing it to the at most two transistors of the slave latch circuit.

6. The method of claim 2, wherein the at most two transistors of the master and slave latch circuits, respectively, comprise a p-type metal-oxide-semiconductor transistor and an n-type metal-oxide-semiconductor transistor.

7. A method to operate a flip-flop circuit, comprising:
receiving a scan-in signal and a data signal;
selectively coupling either the scan-in signal or the data signal to coupled master and slave latches;
based on a clock signal, selectively activating either the master latch or the slave latch so as to latch either the scan-in signal or the data signal as an output signal of the flip-flop circuit, wherein the master latch circuit comprises a pair of cross-coupled AND-OR-Inverter (AOI) logic gates, and the slave latch circuit comprises a pair of cross-coupled OR-AND-Inverter (OAI) logic gates, and wherein the master and slave latch circuits each comprises at most two transistors configured to receive the clock signal; and
providing a logically inverted clock signal to the at most two transistors of the master latch circuit and the at most two transistors of the slave latch circuit, respectively.

8. The method of claim 7, further comprising providing the scan-in signal, the data signal and a scan-enable signal to inputs of a multiplexer having an output coupled to the master latch circuit.

9. The method of claim 7, wherein each of the at most two transistors of the master and slave latch circuits, respectively, receives the inverted clock signal at a respective gate.

10. The method of claim 7, further comprising delaying the inverted clock signal before providing it to the at most two transistors of the master latch circuit but not delaying the inverted clock signal before providing it to the at most two transistors of the slave latch circuit.

11. The method claim 10, further comprising inverting the output of the multiplexer before providing it to the master latch circuit.

12. The method of claim 7, wherein the at most two transistors of the first and second latch circuits, respectively, comprise a p-type metal-oxide-semiconductor transistor and an n-type metal-oxide-semiconductor transistor.

13. The method of claim 7, further comprising delaying the clock signal to the master latch circuit but not delaying the clock signal to the slave latch circuit.

14. A method to operate a flip-flop circuit, comprising:
receiving a scan-in signal at a first input of a multiplexer;
receiving a data signal at a second input of the multiplexer;
receiving a scan-enable signal at a third input of the multiplayer, wherein a logic state of the scan-enable signal selectively couples either the scan-in signal or the data signal to a master latch circuit and a slave latch circuit, wherein the master latch circuit comprises a pair of cross-coupled AND-OR-Inverter (AOI) logic gates, and the slave latch circuit comprises a pair of cross-coupled OR-AND-Inverter (OAI) logic gates;
based on a clock signal, selectively activating either the master latch circuit or the slave latch circuit so as to latch either the scan-in signal or the data signal as an output signal of the flip-flop circuit; and
providing a logically inverted clock signal to the master and slave latch circuits, respectively,
wherein the master and slave latches each comprises at most two transistors configured to receive the clock signal.

15. The method of claim 14, wherein the at most two transistors of the master and slave latch circuits, respectively, each receives the inverted clock signal at a respective gate.

16. The method of claim 14, further comprising delaying the inverted clock signal before providing it to the at most two transistors of the master latch circuit but not delaying the inverted clock signal before providing it to the at most two transistors of the slave latch circuit.

17. The method of claim 16 further comprising inverting the output of the multiplexer before providing it to the master latch circuit.

18. The method of claim 14, wherein the at most two transistors of the first and second latch circuits, respectively, comprise a p-type metal-oxide-semiconductor transistor and an n-type metal-oxide-semiconductor transistor.

19. The method of claim 14, further comprising providing the scan-in signal, the data signal and a scan-enable signal to inputs of a multiplexer having an output coupled to the master latch circuit.

20. The method claim 19, further comprising inverting the output of the multiplexer before providing it to the master latch circuit.

\* \* \* \* \*